(12) United States Patent
Mohrdiek

(10) Patent No.: US 6,771,687 B1
(45) Date of Patent: Aug. 3, 2004

(54) STABILIZED LASER SOURCE

(75) Inventor: Stefan Mohrdiek, Zurich (CH)

(73) Assignee: Bookham Technology plc., Abingdon (GB)

( * ) Notice: Subject to any disclaimer, the term of this patent is extended or adjusted under 35 U.S.C. 154(b) by 110 days.

(21) Appl. No.: 10/049,886

(22) PCT Filed: Sep. 1, 2000

(86) PCT No.: PCT/IB00/01237
§ 371 (c)(1),
(2), (4) Date: May 20, 2002

(87) PCT Pub. No.: WO01/22544
PCT Pub. Date: Mar. 29, 2001

(30) Foreign Application Priority Data

Sep. 21, 1999 (EP) .......................... 99810837

(51) Int. Cl.[7] .............................................. H01S 3/082
(52) U.S. Cl. ................................. 372/97; 372/29.02
(58) Field of Search ................... 372/6, 29.02, 92, 372/97

(56) References Cited

U.S. PATENT DOCUMENTS

| 4,079,339 | A | * | 3/1978 | Kobayashi et al. ........... 372/97 |
| 4,840,456 | A | * | 6/1989 | Fye ............................. 359/566 |
| 4,853,933 | A | * | 8/1989 | Blow et al. ..................... 372/18 |
| 5,485,481 | A | * | 1/1996 | Ventrudo et al. ............... 372/6 |
| 5,677,920 | A | * | 10/1997 | Waarts et al. .................... 372/6 |
| 5,914,972 | A | * | 6/1999 | Siala et al. .................... 372/33 |
| 6,525,872 | B1 | * | 2/2003 | Ziari et al. ............... 359/341.3 |
| 2003/0058905 | A1 | * | 3/2003 | Crawford et al. ........ 372/29.02 |

* cited by examiner

Primary Examiner—Don Wong
Assistant Examiner—James Menefee
(74) Attorney, Agent, or Firm—Renner, Otto, Boisselle & Sklar, LLP

(57) ABSTRACT

The invention relates to the stabilization of semiconductor laser diode sources as they are extensively used in the field of optical communication. Such lasers are mostly employed as so-called pump laser sources for fiber amplifiers, e.g. Erbium-doped fiber amplifiers, and are designed to provide a narrow-bandwidth optical radiation with a stable power output in a given frequency band. To improve the stability of such laser sources compared to prior art designs, a plurality of "external" cavities is provided. In the commonly employed optical fibers for conducting the laser beam, these cavities may be formed by a plurality of appropriately designed Bragg gratings. However, the cavities may as well be formed by other means reflecting a given amount of the energy back to the laser in a desired frequency band, thus effecting the stabilization of the laser's intensity and frequency.

14 Claims, 3 Drawing Sheets

STABILIZED LASER SOURCE

FIELD OF THE INVENTION

The invention relates to the stabilization of a laser, specifically a semiconductor diode laser of the type commonly used in opto-electronics, mostly as so-called pump lasers for fiber amplifiers in the field of optical communication, e.g. for Erbium-doped fiber amplifiers. Such lasers are designed to provide a narrow-bandwidth optical radiation with a stable power output in a given frequency band. In particular, the invention concerns an improved design of the external cavity exhibiting a significantly improved stability compared to prior art designs.

BACKGROUND AND PRIOR ART

Semiconductor lasers of the type mentioned above have, for example, become important components in the technology of optical communication, particularly because such lasers can be used for amplifying optical signals immediately by optical means. This allows to design all-optical fiber communication systems, avoiding any complicated conversion of the signals to be transmitted which improves speed as well as reliability within such systems.

In one kind of optical fiber communication systems, the lasers are used for pumping Erbium-doped fiber amplifiers, so-called EDFAs, which have been described in various patents and publications known to the person skilled in the art. An example of some technical significance are 980 nm lasers with a power output of 150 mW or more, which wavelength matches the 980 nm Erbium absorption line and thus achieves a low-noise amplification. InGaAs lasers have been found to serve this purpose well and are used today in significant numbers. However, the invention is in no way limited to InGaAs lasers.

There are other examples of lasers of other wavelengths and materials for which the present invention is applicable. Generally, laser diode pump sources used in fiber amplifier applications are working in single transverse mode for efficient coupling into single-mode fibers and are mostly multiple longitudinal mode lasers, i.e. Fabry-Perot (or FP) lasers. Three main types are typically being used for Erbium amplifiers, corresponding to the absorption wavelengths of Erbium: InGaAsP and multiquantum-well InGaAs lasers at 1480 nm; strained quantum-well InGaAs lasers at 980 nm; and GaAlAs lasers at 820 nm.

One of the problems occurring when using semiconductor lasers for the above purpose is their wavelength and power output instability which, though small, still affects the amplification sufficiently to look for a solution to the problem. This problem is already addressed in Erdogan et al. U.S. Pat. No. 5,563,732, entitled "Laser Pumping of Erbium Amplifier", which describes the stabilization of a pump laser of the type described above by use of a Bragg grating in front of the laser. This grating forms an external cavity with the laser. The laser bandwidth is broadened and stabilized by the reflection from the grating. It is believed that the laser operation in so-called "coherence-collapse" is obtained by providing sufficient external optical feedback, here from a fiber Bragg grating within the optical fiber into which the laser light is usually coupled. This grating is formed inside the guided-mode region of the optical fiber at a certain distance from the laser. Such a fiber Bragg grating is a periodic structure of refractive index variations in or near the guided-mode portion of the optical fiber, which variations are reflecting light of a certain wavelength propagating along the fiber. The grating's peak-reflectivities and reflection bandwidths determine the amount of light reflected back into the laser.

Ventrudo et al. U.S. Pat. No. 5,715,263, entitled "Fibre-grating-stabilized Diode Laser" describes an essentially similar approach for providing a stabilized laser, showing a design by which the laser light is coupled to the fiber by focussing it through a fiber lens. Again, a fiber Bragg grating is provided in the fiber's guided mode portion, reflecting part of the incoming light back through the lens to the laser. To summarize, when positioning a fiber Bragg grating beyond the coherence length of the laser and when the laser gain peak is not too far from the Bragg grating's center wavelength, it is understood that the laser in coherence collapse operation is forced to operate within the optical bandwidth of the grating and thus is wavelength-stabilized. Additionally, low-frequency power fluctuations seem to decrease by the effect of induced high-frequency multi-mode operation.

In general, the above-described prior art devices must have a length of the external cavity, i.e. the optical fiber, somewhere at least between 0.5 and 1 m, to definitely assure coherence collapse laser operation. For some even up to 2 m long optical fibers are required. This rather long fiber determines the size of the laser source and makes it comparatively bulky.

Some types of semiconductor lasers, especially others than those in the above mentioned patents, e.g. lasers having a narrow spectral gain width, are seen to exhibit instability at certain operating conditions, in particular undesirable switching from multi-mode to single-mode operation within the grating bandwidth. This mode switching (coherence collapse occurs in both cases) results in a fluctuation of the effective laser output which in turn produces noise, thereby negatively affecting or actually disturbing the amplification process. The mode-switching problem is aggravated by new generations of semiconductor laser diodes having at least twice as much output power than the lasers in the Ventrudo or Erdogan patent and the desire of the industry to have wavelength stabilization for all possible operating conditions of a laser.

Other techniques have been proposed to correct fiber amplifier output power fluctuations, e.g. active methods to control the variations in the fiber amplifier output by feedback of an electric signal effecting a correction of the laser power. A further solution is an electronic dithering circuitry forcing the laser to operate multimode, described by Heidemann et al. in U.S. Pat. No. 5,297,154, entitled "Fiber-Optic Amplifier with Feedback-Insensitive Pump Laser". However, the need for active components for these solutions add complexity and cost.

For a quite different purpose, Fischer et al. describe in "High-dimensional Chaotic Dynamics of an External Cavity Semiconductor Laser", Phys. Review Letters, Vol. 73, No. 16, October 1994, pp. 2188–2191, an experimental laser setup with an external T-shaped cavity comprising a beam splatter and high reflecting gold mirrors at each of the two ends of the cavity's two arms. Though this layout shows an external two-cavity arrangement, it is absolutely unsuitable for the purpose of the present invention, since the lengths chosen for the arms of the cavity and the reflectivities of the laser's exit facet and the above-mentioned gold mirrors are selected to avoid the coherence collapse just the opposite of the present invention, where coherence collapse is a prerequisite.

Also in a very different field, Wang Xianghyang et al. disclose a "Theoretical and Experimental Study on the Fabrication of Double Fiber Bragg Gratings" in the journal Optical Fiber Technology: Materials, Devices and Systems, Vol. 3, No. 2, pp. 189–193. Double gratings are provided at the same location within the fiber and this "chirped" grating is said to widen the transmission spectrum of the fiber. Again, this publication does nowhere address the problem that the invention intends to solve.

Thus, it is the main object of the invention to devise a simple and reliable laser source layout, especially for pump lasers in optical fiber communication systems, that provides a stable output under all operating conditions. A specific object is to avoid the detrimental mode switching of the laser, even for a laser output power of more than 150 mW, and thus increase the stability of the output of high power laser sources. Output stability shall be achieved for high optical power having reduced low frequency noise, wavelength stability and high side lobe suppression outside the fiber Bragg grating bandwidths.

A further object is to allow maximum flexibility for choosing the lasers parameters without running into stability problems.

A still further object is to avoid any further complexity and keep the number of additional components of the laser source within a laser pumped optical amplifier to a minimum.

A particular object is to create a stabilized laser source of reduced size by using a significantly shortened external cavity region.

THE INVENTION

In brief, to solve the problems addressed above, the present invention does not use a single grating or cavity in front of the laser, but a plurality of appropriately arranged cavities. These cavities are preferably arranged in series, but can also be arranged in parallel. If the lengths of the cavities, their reflectivities, and their peak wavelengths are chosen accordingly, the laser is forced to operate multimode under all or practically all operating conditions.

Whereas one single grating is known to act as a wavelength broadening and stabilization element, it is understood that multiple cavities according to the invention impose a useful destabilization only within the compound bandwidth of all gratings high enough to force the laser into multimode operation. In a way, this phenomenon may be named as a "photonic dither" with a similar effect as an electronic dither, but by means of passive components only.

Another advantage of the invention is that the total length of the external cavities can be reduced to less than the length of the prior art designs. This provides for smaller laser sources.

One preferred embodiment according to the invention has a first reflector in front of a semiconductor laser diode forming a first cavity and, at an optimized distance, a second reflector in front of the first one, forming a second cavity between the first and the second reflector within the optical fiber. The peak wavelength of the second reflector may be chosen close, but not necessarily identical to that of the first reflector. Also, a certain offset of the peak wavelengths and/or bandwidths of the two reflectors may improve performance. Further, any one or both cavities may be shorter than the coherence length of the laser diode.

Preferably, the phase relationship between the two reflectors is chosen such that the resulting waves or fields are—statistically seen—practically out of phase.

The reflectors can be of any kind suitable for the desired purpose; they are preferably provided as Bragg gratings within the optical fiber, which simplifies their making and avoids the need to have any parts or components added.

A preferred method for providing the desired plurality of cavities is to establish them by simultaneously producing the desired Bragg gratings within the optical fiber. This keeps the additional efforts to fabricate the additional cavities at a minimum and, at the same time, provides for close tolerances of the desired layout.

DETAILED DESCRIPTION OF PREFERRED EMBODIMENTS

In the following, various embodiments of the invention shall be described by reference to the drawings, in which.

Figure 1:
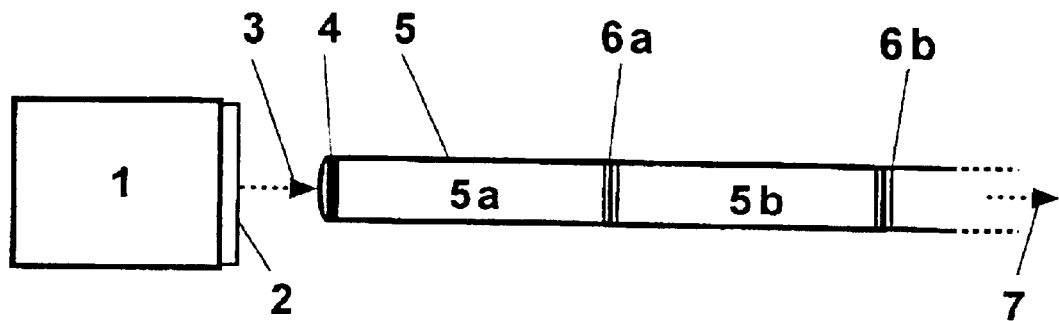
FIG. 1 shows the layout of a first embodiment using fiber Bragg gratings.

FIG. 1 shows the basic layout of a first embodiment according to the invention. A semiconductor diode laser 1, here an InGaAs quantum well laser, produces a laser light beam 3 that is emitted predominantly from the laser front facet 2. This beam is coupled into a suitable optical fiber 5 via a fiberlens 4, focusing the beam onto the input end of the fiber 5. Within the optical fiber 5, a first fiber Bragg grating 6a is arranged in a distance L1 from the laser 1. In a distance L2 from this first grating 6a, a second fiber Bragg grating 6b is provided. The controlled and now incoherent—as described above—exiting light beam 7 leaves the optical fiber 5 and is fed into a fiber amplifier, e.g. an Erbium-doped fiber amplifier not shown here.

The semiconductor laser is usually of a type that emits confined light in a single transversal and lateral mode, but has several longitudinal modes due to the Fabry-Perot cavity formed between the front and rear facet. If the laser facet reflectivity has a value as low as $10^{-5}$, the laser cavity extends essentially into the fiber with the fiber Bragg grating defining the end facet. In this case, the laser operates more likely in coherence with the fiber Bragg grating. Thus, a higher front facet reflectivity of the laser typically on the order of 4% is desired to ensure coherence-collapse. On the other hand, if the reflectivity is chosen too high, the optical output power is decreased. The efficiency of the light coupled from the laser into the fiber through the fiber lens can be about 70% in production and approaching 85% in the lab and/or for specially designed lasers. Hence, the efficiency of fiber Bragg grating back reflection into the laser is then given by the squared coupling efficiency times the Bragg grating reflectivity. Typically, more than 90% of the light passes the Bragg grating whereas the rest is reflected back into the laser, if it is the first grating, or passing through another fiber Bragg grating with a part of it reflected back again.

If the wavelength of the free-running laser without backreflection, roughly corresponding to the laser gain peak, is too far from the fiber Bragg grating peak, the laser may fall off the locking to the Bragg grating. A 20 nm wavelength range can be typically locked to the fiber Bragg grating peak, denoted as the so called capture range. The grating bandwidth is determined by the needs for pump wavelength channel separation in EDFAs with a typical maximum limit of 2 nm. From a manufacturing viewpoint, the full-width half-maximum bandwidths can be chosen between 0.4 and 0.8 nm for a certain peak reflectivity. A laser-to-grating distance of >50 cm ensures coherence collapse, but this distance can be smaller if several gratings (cavities) are used. The well known fiber Bragg grating fabrication is based on exposure to UV radiation periodically along a piece of the optical fiber, as described e.g. by Raman Kashyap in "Fiber Bragg Gratings", Academic Press, 1999.

The reflectivity of the multiple gratings is an optimization versus output power. The effective, or compound reflectivity given by all gratings can be in the same range as the laser facet reflectivity. A wavelength overlap is also necessary to establish another cavity. A concrete example with two gratings, each with 3% reflectivity, (i.e. 2×3% reflectivity) and 0.6 nm bandwidth at the same peak wavelength gives excellent results. The function of having multiple cavities is given by the roundtrip time the portion of the backreflected light needs to get back into the laser cavity. It can be seen as a "photonic dither" with frequencies corresponding to the roundtrip times through the various cavities. A working example has a laser-grating distance L1 of 1 m and a grating-grating distance L2 of 10 cm, yielding roundtrip frequencies of 100 MHz and 1 GHz, respectively. Distortions at different frequencies determined by the roundtrip time (length) of the multiple cavities forces the laser to become multimode. The light leaving the last fiber Bragg grating entering the path to the EDFA shows minimal low frequency noise with typically 90% of the light confined to the bandwidth determined by the grating. Some noise at high frequencies exists due to mode beating, but does not interfere with the slowly reacting ions of the subsequent Erbium-doped amplifier.

Figure 2:
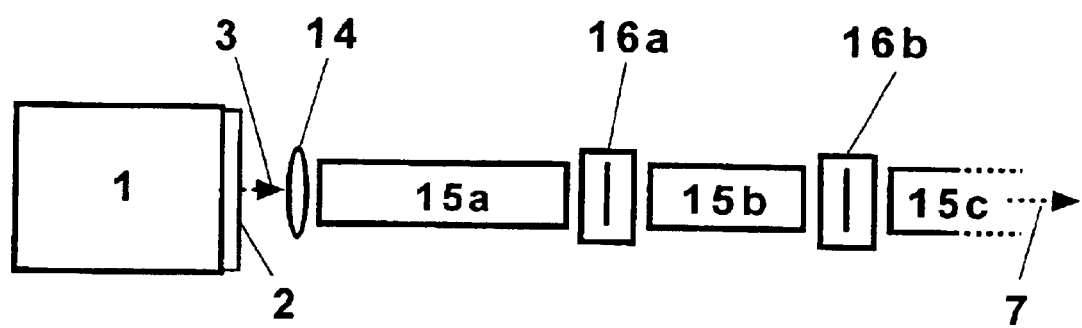
FIG. 2 depicts the layout of a second embodiment using other reflectors instead.

A different method to get distortion by light reflected back into the laser is to have different grating wavelengths, where the first grating acts as the master grating, locking the pump wavelength, and the second grating, with a lower reflectivity, acts as a noise-producing element FIG. 2 shows a second embodiment, essentially an arrangement wherein the fiber Bragg gratings 6a and 6b of FIG. 1 have been replaced by reflectors 16a and 16b, which may be e.g. a set of interferometric filters. This set of filters has essentially the same function as Bragg gratings with similar reflection and transmission characteristics. They can either be discrete elements between the fibers (as shown in FIG. 2) or can be deposited directly onto the fiber. Also, the fiberlens 4 has been replaced by another collimating means, here a lens system 14. The optical fiber is partitioned into three sections 15a, 15b, and 15c. The light beam 7 exits from the last section of the optical fiber 15c, as in FIG. 1. Regarding the dimensions in this second embodiment, the same rules and calculations as described above in connection with the embodiment of FIG. 1 apply.

There is no rear reflector shown at the laser 1 in both FIGS. 1 and 2, but it is clear for a person skilled in the art that such a reflector or mirror is usually provided.

Figure 3:
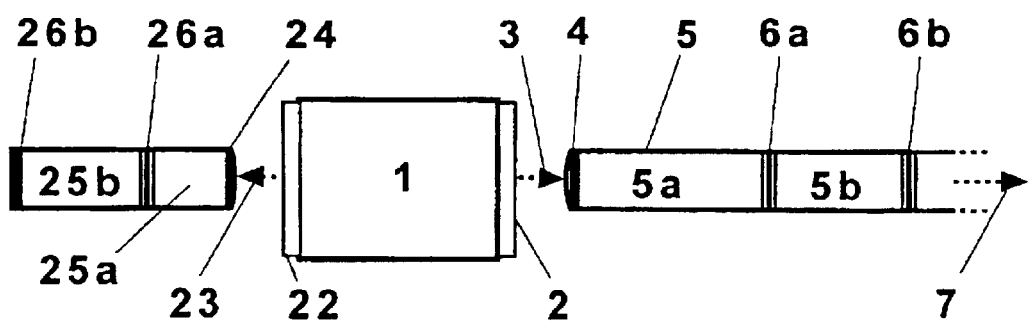
FIG. 3 shows a third embodiment with cavities on both ends of the laser.

FIG. 3 depicts a layout with cavities both in front of the laser and at the rear of it. Whereas cavities 5a and 5b are located essentially similar to the embodiment shown in FIG. 1, some light exits the laser 1 through its rear facet 22, entering, preferably through a fiberlens 24, the two rear cavities 25a and 25b, established by a fiber Bragg grating 26a and a rear fiber reflector 26b. The reflectivity at the rear laser facet and/or the compound reflectivity of all rear gratings should be higher than 90%, preferably 100% to maximize the output power at the laser's front facet. Again, the rules and calculations described above in connection with FIG. 1 apply with respect to the dimensions and reflectivities in this third embodiment,.

Figure 4:
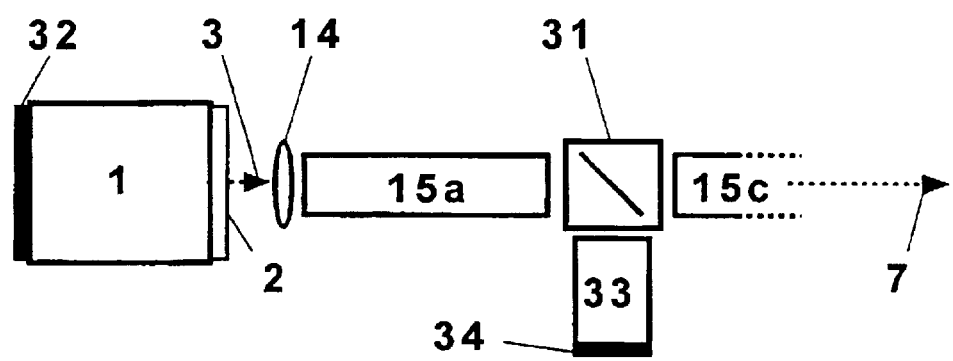
FIG. 4 is a fourth embodiment with frontal and lateral cavities.

FIG. 4 displays a fourth embodiment of the invention with "parallel" cavities instead of a series of cavities, here a "frontal" cavity 15a and a "lateral" cavity 33. This embodiment is shown to explain how the functionality of the invention can be achieved by a quasi-parallel instead of a serial setup of feedback cavities. A beam splitter/combiner 31 divides the laser beam, where typically more than 90% of the laser light is coupled out into the fiber 15c to exit the system, whereas a certain portion is reflected into the fiber 15a acting as first cavity. A smaller portion of the laser light is deflected into the cavity 33 and therein backreflected at the mirror 34. This mirror 34 ideally has a reflectivity of 100%, the same as the rear laser reflector 32. The roundtrip frequency is again determined by the lengths of the cavities, working as the necessary distortion elements leading the laser 1 to multimode operation.

The layout shown in FIG. 4 may be modified by adding a further cavity right of the beam splitter/combiner 31 similar to the two-cavity layout of FIG. 2. Another modification of the layout of FIG. 4 could add one or more rear cavities similar to the layout shown in FIG. 3. To summarize, based on the teaching given and without departing from the spirit and scope of the invention, it should be relatively easy for a person skilled in the art to combine any of the designs shown, or to add portions of one design to another, and to determine the dimensions according to the teaching given particularly in connection with FIG. 1.

Figure 5:
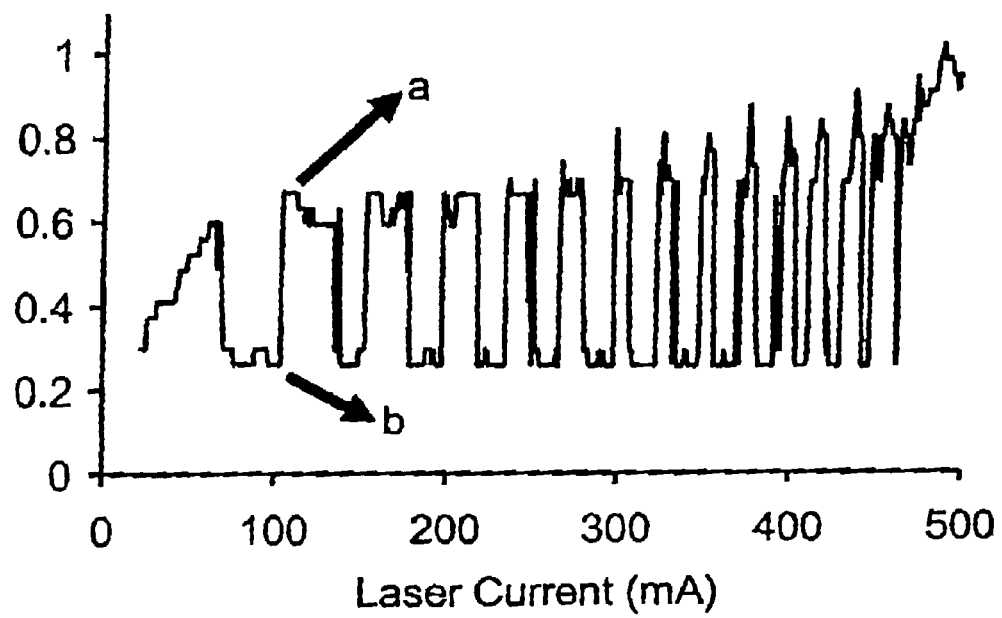
FIG. 5 is a graph of a laser's optical bandwidth at −20 dB down from the maximum stabilized by a single fiber Bragg grating according to the related art.

FIG. 5 shows in graphical form the output of a laser known from the related art whereby the bandwidth stabilization is attempted by a single fiber Bragg grating. The vertical axis is the laser's optical bandwidth at 20 dB down from the maximum; the horizontal axis is the laser current. The graph clearly shows the fluctuations by the laser's switching from multi-mode bandwidth (a) to a narrow single mode (b) operation or bandwidth while the laser's driving current is ramped up. In other words, the shown curve exhibits just the problem that the present invention tends to solve.

Figure 6:
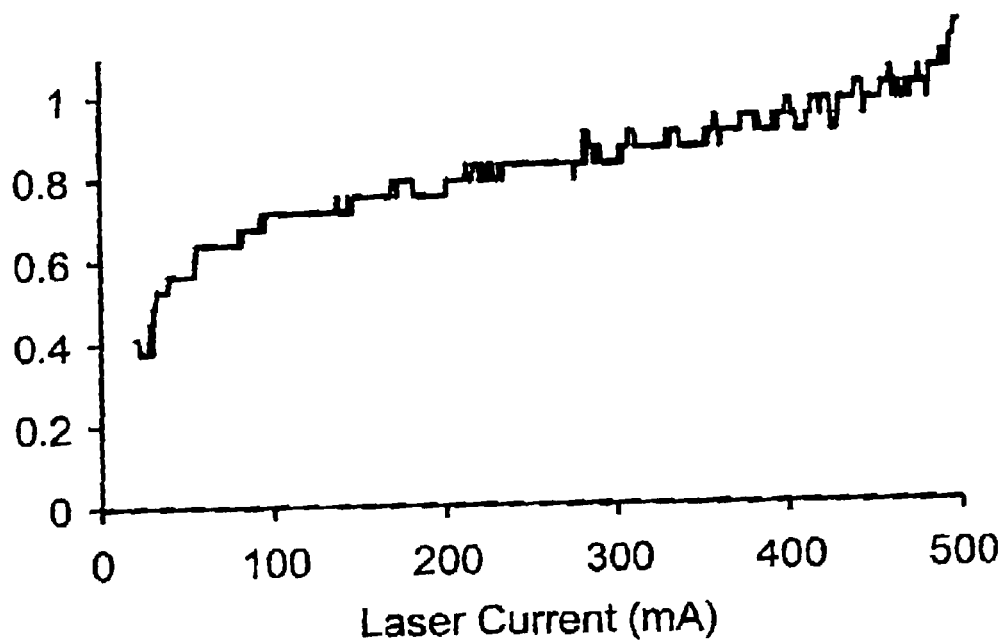
FIG. 6 is a graph showing the improvement when a second cavity is implemented according to the invention (here using a second fiber Bragg grating).

FIG. 6 finally exhibits the progress achieved by the present invention in a graph similar to the one in FIG. 5. Again, the vertical axis is the laser's optical bandwidth at −20 dB down from the maximum; the horizontal axis is the current of a laser source according to the invention. By use of an additional cavity formed by a second grating or other reflector system, e.g. as described in detail in connection with FIG. 1, the laser source is solely operating in multimode. There are no switching fluctuations, the significant improvement is clearly visible.

What is claimed is:

1. A laser source for generating a stable laser beam of a given bandwidth, including a laser and guide means for conducting the laser beam exiting said laser's front facet, comprising
   a plurality of external cavities at least partly within or as part of said laser beam guide means, each of said cavities being established by two fixed reflectors, one of which being located in said laser beam guide means,
   said plurality of external cavities being dimensioned and arranged such that said laser operates essentially in a coherence collapse mode.

2. The laser source according to claim 1, wherein
all cavities are situated within the laser beam guide means, in front of the laser.

3. The laser source according to claim 1, wherein
one or more cavities are arranged within the laser beam guide means in front of the laser, and
at least one cavity is arranged at the rear of the laser.

4. The laser source according to claim 1, including in combination
a "serial" cavity arranged within the laser beam guide means,
a "lateral" cavity arranged outside said laser beam guide means, and
a beam splitter/combiner deflecting a portion of the beam into said lateral cavity.

5. The laser source according to claim 4, wherein
the laser emits light between 800 and 1600 nm and/or
the beam splitter/combiner has a reflectivity maximum within the bandwidth of the laser, and/or
a bandwidth of its reflectivity between 0.05 and 2 nm full-width half-maximum, and/or
a peak reflectivity between 0.005 and 0.4.

6. The laser source according to claim 1, wherein
the reflectors located in the laser beam guide means are Bragg gratings, whose peak wavelengths are offset and/or whose bandwidths are different.

7. The laser source according to claim 1, wherein
the laser emits light between 800 and 1600 nm and/or
any of the reflectors has a reflectivity maximum within the bandwidth of the laser, and/or
a bandwidth of its reflectivity between 0.05 and 2 nm full width half-maximum, and/or
a peak reflectivity between 0.005 and 0.4.

8. The laser source according to claim 1, wherein
the optical field established in the first cavity is out of phase with the optical field of the laser, and
the optical field established in the second cavity is out of phase with the optical field established in said first cavity,
thus inhibiting phase matching with the laser and hence coherent operation of said laser source.

9. The laser source according to claim 1, wherein
the laser is a semiconductor diode laser, and/or
the laser guide means comprises an optical fiber, either a polarization-maintaining or non-polarization maintaining optical fiber, and
the reflectors are fiber Bragg gratings within said/a fiber.

10. The laser source according to claim 1, further comprising
means for directing the laser beam into the optical fiber, in particular beam collimating or focusing means attached to or integrated into an optical fiber.

11. The laser source according to claim 1, wherein
one of the fixed reflectors by which each of the cavities is established is the laser's front facet.

12. The laser source according to claim 1, wherein
the laser is an InGaAs quantum well diode laser, and/or
the laser guide means comprises an optical fiber, either a polarization-maintaining or non-polarization maintaining optical fiber, and
the reflectors are fiber Bragg gratings within said fiber.

13. A method of making a laser source that generates a stable laser beam of a given bandwidth, said laser source having a laser and laser beam guide means in front of said laser, characterized by
simultaneously manufacturing within said laser beam guide means, a plurality of fixed reflectors, which form, together with the laser front facet, a plurality of external cavities in front of said laser.

14. The method of making a laser source according to claim 13, whereby
the simultaneous manufacturing is carried out by UV exposure methods creating the reflectors as fiber Bragg gratings in the optical fiber constituting the laser beam guide means.

* * * * *